United States Patent
Cho et al.

(10) Patent No.: US 9,066,380 B2
(45) Date of Patent: Jun. 23, 2015

(54) LIGHT-EMITTING DISPLAY DEVICE INCLUDING A DESTRUCTIVE INTERFERENCE UNIT AND METHOD OF FABRICATING THE SAME

(71) Applicant: Samsung Display Co., Ltd., Yongin, Gyeonggi-Do (KR)

(72) Inventors: Sang Hwan Cho, Yongin (KR); Soo Youn Kim, Yongin (KR); Sang Hyun Park, Yongin (KR); Yoon Hyeung Cho, Yongin (KR); Seung Yong Song, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/061,631

(22) Filed: Oct. 23, 2013

(65) Prior Publication Data

US 2014/0361682 A1 Dec. 11, 2014

(30) Foreign Application Priority Data

Jun. 7, 2013 (KR) .................. 10-2013-0065299

(51) Int. Cl.
*H05B 33/02* (2006.01)
*H05B 33/10* (2006.01)

(52) U.S. Cl.
CPC ............... *H05B 33/02* (2013.01); *H05B 33/10* (2013.01)

(58) Field of Classification Search
USPC ............. 313/498–513; 315/169.1, 169.3; 257/40, 72, 98–100, 642–643, 759
See application file for complete search history.

(56) References Cited

U.S. PATENT DOCUMENTS

| | | | |
|---|---|---|---|
| 6,876,018 B2 | 4/2005 | Ko | |
| 8,004,641 B2* | 8/2011 | Yang et al. | 349/137 |
| 2002/0197824 A1* | 12/2002 | Katsuragawa | 438/437 |
| 2011/0234088 A1* | 9/2011 | Abe | 313/504 |

FOREIGN PATENT DOCUMENTS

| | | |
|---|---|---|
| KR | 10-2000-0035364 A | 6/2000 |
| KR | 10-2005-0119894 A | 12/2005 |
| KR | 10-2009-0092113 A | 8/2009 |
| KR | 10-2011-0018069 A | 2/2011 |
| KR | 10-2012-0092907 A | 8/2012 |

* cited by examiner

*Primary Examiner* — Tracie Y Green
(74) *Attorney, Agent, or Firm* — Knobbe Martens Olson & Bear LLP

(57) ABSTRACT

In an aspect, a light-emitting display device and a method of fabricating the same is provided. The light-emitting display device includes a display substrate which comprises a pixel region and a non-pixel region; an encapsulation member which is disposed above the display substrate; and a destructive interference unit.

20 Claims, 16 Drawing Sheets

LIGHT-EMITTING DISPLAY DEVICE INCLUDING A DESTRUCTIVE INTERFERENCE UNIT AND METHOD OF FABRICATING THE SAME

INCORPORATION BY REFERENCE TO RELATED APPLICATIONS

Any and all priority claims identified in the Application Data Sheet, or any correction thereto, are hereby incorporated by reference under 37 CFR 1.57. For example, this application claims priority from Korean Patent Application No. 10-2013-0065299 filed on Jun. 7, 2013 in the Korean Intellectual Property Office, the disclosure of which is incorporated herein by reference in its entirety.

BACKGROUND

1. Field

This disclosure relates to a light-emitting display device and a method of fabricating the same.

2. Description of the Related Technology

Conventional display devices are being replaced by portable and thin display devices. Among display devices, organic light-emitting display devices or inorganic light-emitting display devices are considered as next-generation display devices because they are self-emissive display devices having a wide viewing angle, high contract and fast response speed.

To be portable and usable in an outdoor environment, display devices are fabricated lightweight and thin. However, when a user watches images displayed on a display device in the outdoor environment, the display device reflects ambient light such as sunlight, thus degrading image contrast and visibility. In the case of an organic light-emitting display device, ambient light is reflected by a reflective metal layer inside the organic light-emitting display device. Therefore, in order to reduce reflection of ambient light, a circular polarizer may be placed on a surface of the organic light-emitting display device.

However, the circular polarizer consists of a number of films including a linear polarizer, a ¼-wavelength phase difference plate, an adhesive layer, a protective layer, etc. and has a thickness of approximately 0.15 mm to 0.3 mm. Thus, there are limitations in realizing a thin display device using the circular polarizer. In addition, since the circular polarizer is formed by laminating a number of films, the process of fabricating a display device including the circular polarizer is complicated.

SUMMARY

Some embodiments provide a light-emitting display device having a destructive interference unit which can replace a circular polarizing film, reduce reflectance of ambient light, reduce a thickness of the light-emitting display device, and simplify a process of fabricating the light-emitting display device.

Some embodiments provide a method of fabricating a light-emitting display device having a destructive interference unit which can replace a circular polarizing film, reduce reflectance of ambient light, reduce a thickness of the light-emitting display device, and simplify a process of fabricating the light-emitting display device.

However, aspects of the present disclosure may be embodied in various different forms, and should not be construed as being limited only to the illustrated embodiments. The above and other aspects of the present disclosure will become more apparent to one of ordinary skill in the art to which this technology pertains by referencing the detailed description of the embodiments given below.

According to an aspect of the present disclosure, there is provided a light-emitting display device comprising: a display substrate which comprises a pixel region and a non-pixel region; an encapsulation member which is disposed above the display substrate; and a destructive interference unit which is formed on the encapsulation member and comprises a light-transmitting portion corresponding to the pixel region and a light-blocking portion corresponding to the non-pixel region.

According to other aspect of the present disclosure, there is provided a light-emitting display device comprising: a display substrate which comprises a pixel region and a non-pixel region; an encapsulation member which is disposed above the display substrate; and a destructive interference unit which is formed on the encapsulation member, wherein the destructive interference unit comprises a plurality of metal-containing layers and a plurality of dielectric layers which are stacked alternately and further comprises a blocking layer which corresponds to the non-pixel region and is disposed closest to or farthest from the encapsulation member.

According to another aspect of the present disclosure, there is provided a method of fabricating a light-emitting display device, the method comprising: preparing a display substrate comprising a pixel region and a non-pixel region; forming a destructive interference unit comprising a plurality of metal-containing layers and a plurality of dielectric layers which are stacked alternately on an encapsulation member and further comprising a blocking layer which corresponds to the non-pixel region and is placed closest to or farthest from the encapsulation member.

According to the embodiments of the present disclosure, at least the following effects can be achieved.

In some embodiments, the light-emitting display device has a destructive interference unit including a plurality of metal-containing layers and a plurality of dielectric layers, which are alternately stacked on the encapsulation member, and the blocking layers. In some embodiments, the destructive interference unit can replace a circular polarizing film, reduce reflectance of ambient light, reduce a thickness of the light-emitting display device, and simplify the process of fabricating the light-emitting display device.

The effects according to the present disclosure are not limited to the contents as exemplified above, but further various effects are included in the description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Advantages and features of the present disclosure and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the embodiments to those skilled in the art, and the present invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present disclosure will be described with reference to the attached drawings.

Figure 1:
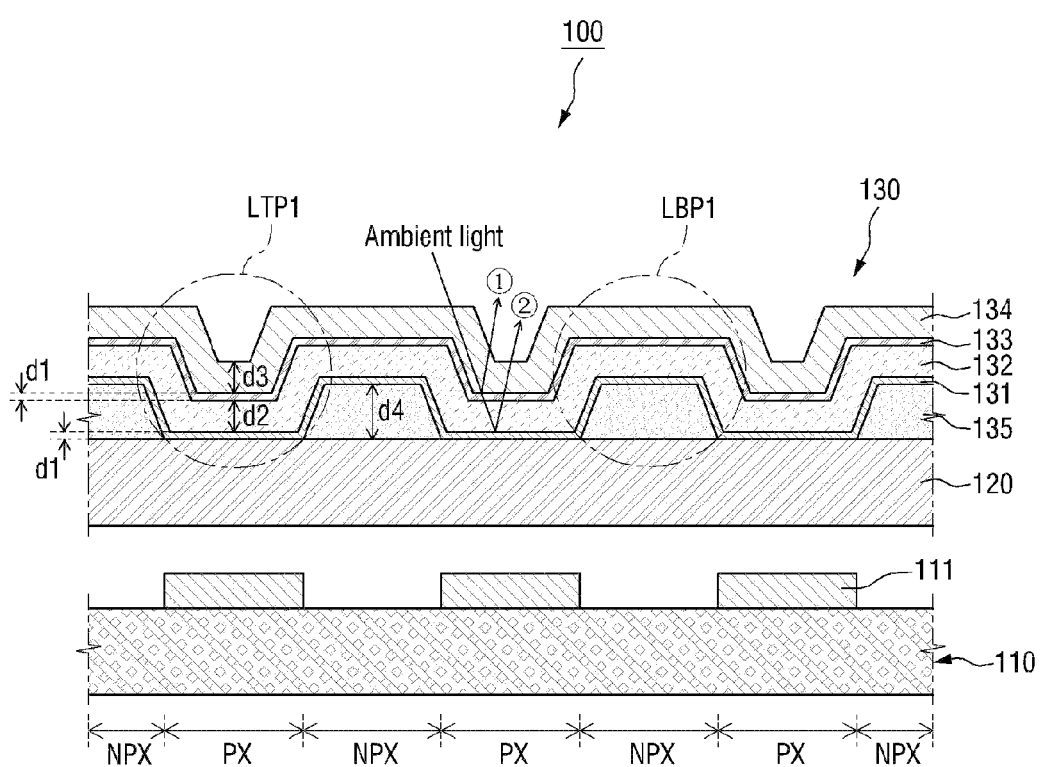
FIG. 1 is a cross-sectional view of a light-emitting display device according to an embodiment of the present disclosure.
Figure 2:
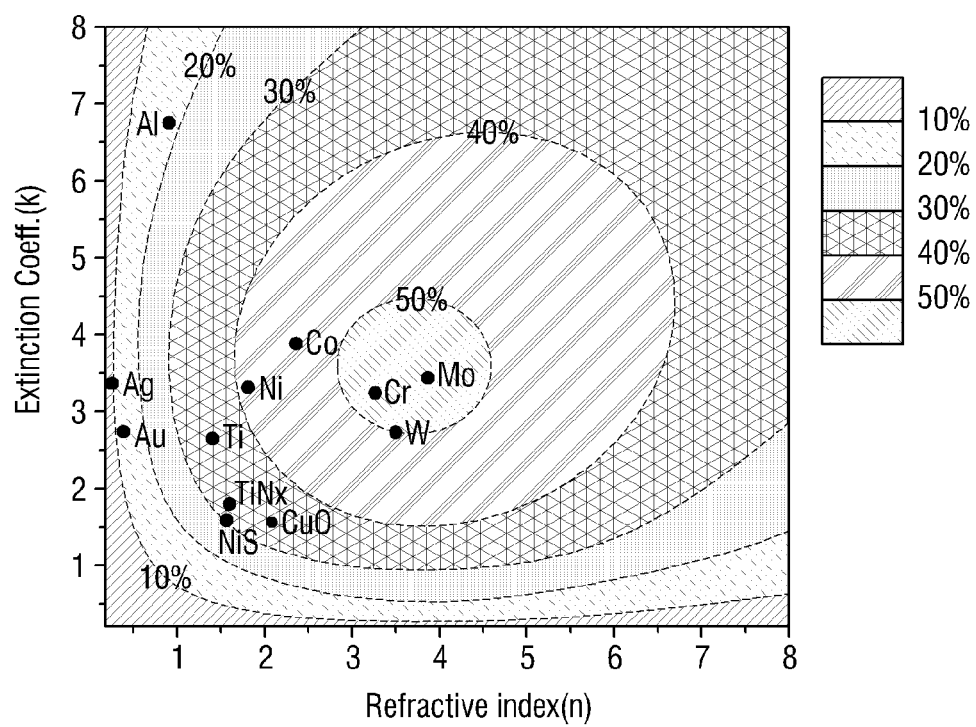
FIG. 2 is a graph illustrating absorption rates of arbitrary materials.

FIG. 1 is a cross-sectional view of a light-emitting display device 100 according to an embodiment of the present disclosure. FIG. 2 is a graph illustrating absorption rates of arbitrary materials.

Referring to FIG. 1, the light-emitting display device 100 according to the current embodiment includes a display substrate 110, an encapsulation member 120, and a destructive interference unit 130.

In some embodiments, the display substrate 110 may include an insulating substrate. In some embodiments, the insulating substrate may be formed of a transparent glass material containing transparent $SiO_2$ as its main component. In some embodiments, the insulating substrate may be formed of an opaque material or a plastic material. In some embodiments, the insulating substrate may be a flexible substrate.

In some embodiments, the display substrate 110 may include pixel regions PX which display images and non-pixel regions NPX. In some embodiments, the display substrate 110 may include light-emitting layers 111 which are formed respectively on the pixel regions PX and emit light so that an image can be displayed. If the light-emitting display device 100 is, for example, an organic light-emitting display device, the light-emitting layers 111 may be organic light-emitting layers formed of an organic material.

Although not shown in the drawing, the substrate 110 may further include other structures formed on the insulating substrate. Examples of the structures may include wirings, electrodes, and insulating layers. In some embodiments, the substrate 110 may include first electrodes (e.g., anodes) formed under the light-emitting layers 111 and a second electrode (e.g., a cathode) formed on the light-emitting layers 111. In some embodiments, the substrate 110 may include a plurality of thin-film transistors (TFTs) formed on the insulating substrate. In some embodiments, drain electrodes of at least some of the TFTs may be electrically connected to the first electrodes. In some embodiments, each of the TFTs may include an active region formed of amorphous silicon, polycrystalline silicon, or monocrystalline silicon. In some embodiments, each of the TFTs may include an active region formed of oxide semiconductor.

In some embodiments, the encapsulation member 120 may be disposed above the display substrate 110 and may be formed of an insulating material. In some embodiments, the encapsulation member 120 may be coupled to the display substrate 110 in order to protect the light-emitting layers 111 from moisture and oxygen outside the light-emitting display device 100. In some embodiments, the encapsulation member 120 may be an encapsulation substrate which is disposed on the display substrate 110 with a gap therebetweeen or an encapsulation layer which contacts the display substrate 110, for example, an encapsulation layer that covers the entire structure of the display substrate 110.

In some embodiments, the destructive interference unit 130 may be formed on the encapsulation member 120 and may be disposed at the upper part of the encapsulation member. In some embodiments, the destructive interference unit 130 broadly includes light-transmitting portions LTP1 corresponding to the pixel regions PX of the display substrate 110 and light-blocking portions LBP1 corresponding to the non-pixel regions NPX of the display substrate 110.

In some embodiments, the light-transmitting portions LTP1 corresponding to the pixel regions PX of the display substrate 110 allow light emitted from the light-emitting layers 111 to transmit therethrough, so that an image can be displayed outside the destructive interference unit 130. In some embodiments, the light-transmitting portions LTP1 can reduce reflectance of ambient light incident from outside the destructive interference unit 130 toward the encapsulation member 120 by causing reflected lights of the ambient light to destructively interfere with each other. In some embodiments, the light-blocking portions LBP1 corresponding to the non-pixel regions NPX prevent light emitted from the light-emitting layers 111 from transmitting therethrough and reduce reflectance of ambient light incident from outside the destructive interference unit 130 toward the encapsulation member 120 by causing reflected lights of the ambient light to destructively interference with each other and by absorbing the ambient light. The light-transmitting portions LTP1 and the light-blocking portions LBP1 will be described in more detail later.

In some embodiments, the destructive interference unit 130 may include a plurality of metal-containing layers (131, 133) and a plurality of dielectric layers (132, 134), which are stacked alternately on the encapsulation member 120, and blocking layers 135. In some embodiments, the destructive interference unit 130 may include a first metal-containing layer 131, a first dielectric layer 132, a second metal-containing layer 133, a second dielectric layer 134, and the blocking layers 135. In the stacked structure of the metal-containing layers (131, 133) and the dielectric layers (132, 134) shown in FIG. 1, the first metal-containing layer 131, the first dielectric layer 132, the second metal-containing layer 133 and the second dielectric layer 134 are sequentially stacked on the encapsulation member 120. However, in a stacked structure of a plurality of metal-containing layers and a plurality of dielectric layers according to some embodiments, a first dielectric layer, a first metal-containing layer, a second dielectric layer and a second metal-containing layer may be sequentially stacked on an encapsulation member.

In some embodiments, the first metal-containing layer 131 may be formed on the encapsulation member 120. In some embodiments, portions of the first metal-containing layer 131 which correspond to the pixel regions PX of the display substrate 110 may contact the top surface of the encapsulation member 120, and portions of the first metal-containing layer 131 which correspond to the non-pixel regions NPX of the display substrate 110 may be separated from the top surface of the encapsulation member 120. In some embodiments, the first metal-containing layer 131 may be formed of a material with a high absorption rate, for example, a metal-containing material with an absorption rate of approximately 30% or more in order to reduce the amount of ambient light that is reflected by absorbing some of ambient light incident from outside the destructive interference unit 130. Referring to FIG. 2, the metal-containing material with an absorption rate of approximately 30% or more may have a refractive index n of approximately 1.5 to 7 and an extinction coefficient k of approximately 1.5 to 7. Accordingly, the first metal-containing layer 131 may be formed of any one of chrome (Cr), molybdenum (Mo), tungsten (W), titanium (Ti), nickel (Ni), cobalt (Co), copper oxide (CuO), titanium nitride, and nickel sulfide (NiS). The refractive index n and extinction coefficient k of each material shown in FIG. 2 were measured in a state where each material had a thickness of 10 nm and where an optical wavelength was 550 nm.

In some embodiments, the first metal-containing layer 131 may be formed to a thickness d1 having a transmittance of approximately 40% or more which is similar to a transmittance of approximately 43% or more for a conventional circular polarizing film. In some embodiments, the thickness d1 of the first metal-containing layer 131 may be set to a thickness having an absorption rate of approximately 60% or less and may be set to a thickness that satisfies Equation (1) below:

$$d1 \leq 0.6\lambda/2\pi n1 k1, \quad (1)$$

where d1 is a thickness of the first metal-containing layer 131, $\lambda$ is a wavelength of ambient light, n1 is a refractive index of the first metal-containing layer 131, and k1 is an extinction coefficient of the first metal-containing layer 131.

For example, if the wavelength $\lambda$ of the ambient light is 550 nm and the first metal-containing layer 131 is formed of Cr, the refractive index n1 of the first metal-containing layer 131 is approximately 3.2, and the extinction coefficient k1 of the first metal-containing layer 131 is approximately 3.3 as shown in FIG. 2. Here, the thickness d1 of the first metal-containing layer 131 may be approximately 4.97 nm or less according to Equation (1). In the present disclosure, the thickness d1 of the first metal-containing layer 131 is set based on the assumption that the wavelength of the ambient light is 550 nm. However, the thickness d1 of the first metal-containing layer 131 can also be set based on another wavelength.

In some embodiments, the first dielectric layer 132 may be formed on the first metal-containing layer 131. In some embodiments, the first dielectric layer 132 contacts a top surface of the first metal-containing layer 131. In some embodiments, the first dielectric layer 132 may be formed of any one of silicon oxide (SiO$_2$), titanium oxide (TiO$_2$), lithium fluoride (LiF), calcium fluoride (CaF$_2$), magnesium fluoride (MaF$_2$), silicon nitride, tantalum oxide (Ta$_2$O$_5$), niobium oxide (Nb$_2$O$_5$), silicon carbonitride (SiCN), molybdenum oxide, iron oxide, and chrome oxide. In some embodiments, the first dielectric layer 132 may adjust a difference between a phase of a first reflected light ① which ambient light is reflected from a top surface of the second metal-containing layer 133 and a phase of a second reflected light ② which ambient light transmits through the second metal-containing layer 133 and the first dielectric layer 132 to be reflected from the top surface of the first metal-containing layer 131 and then transmits through the first dielectric layer 132 and the second metal-containing layer 133 to emerge from the top surface of the second metal-containing layer 133 to be approximately 180 degrees, so that the ambient light reflected from the destructive interference unit 130 can be offset.

In some embodiments, the second metal-containing layer 133 may be formed on the first dielectric layer 132. In some embodiments, the second metal-containing layer 133 contacts a top surface of the first dielectric layer 132. In some embodiments, the second metal-containing layer 133 may also be formed of the material that forms the first metal-containing layer 131 in order to reduce the amount of light that is reflected from among ambient light incident from outside the destructive interference unit 130. In some embodiments, a thickness d1 of the second metal-containing layer 133 may be set to a thickness having an absorption rate of approximately 60% or less which is equivalent to a transmittance of approximately 43% or more for a conventional circular polarizing film and may be set to a thickness that satisfies Equation (1).

To cause the difference between the phase of the first reflected light ① and the phase of the second reflected light ② become approximately 180 degrees, an optimum optical thickness of the second metal-containing layer 133 and the first dielectric layer 132 may be set to a length λ/4 (defined by Equation (2)) that causes the phase of the ambient light incident from outside the destructive interference unit 130 to be changed by approximately 90 degrees when the ambient light passes through the second metal-containing layer 133 and the first dielectric layer 132. Accordingly, a thickness d2 of the first dielectric layer 132 may be calculated by Equation (2) below:

$$(n1d1)+(n2d2)=\lambda/4, \qquad (2)$$

where d1 is a thickness of the second metal-containing layer 133, d2 is a thickness of the first dielectric layer 132, λ is a wavelength of ambient light, n1 is a refractive index of the second metal-containing layer 133, and n2 is a refractive index of the first dielectric layer 132.

For example, if the wavelength λ of the ambient light is 550 nm, the second metal-containing layer 133 is formed of Cr, and the first dielectric layer 132 is formed of $SiO_2$, the refractive index n1 of the second metal-containing layer 133 may be approximately 3.2, the thickness d1 of the second metal-containing layer 133 may be approximately 4.97 nm, and the refractive index n2 of the first dielectric layer 132 may be approximately 1.47. Here, the thickness d1 of the first dielectric layer 132 may be approximately 82.72 nm according to Equation (2). In the present disclosure, the thickness d1 of the second metal-containing layer 133 and the thickness d2 of the first dielectric layer 132 are set based on the assumption that the wavelength of the ambient light is 550 nm. However, the thickness d1 of the second metal-containing layer 133 and the thickness d2 of the first dielectric layer 132 can also be set based on another wavelength.

In some embodiments, the second dielectric layer 134 may be formed on the second metal-containing layer 133. In some embodiments, the second dielectric layer 134 may be formed of the material that forms the first dielectric layer 132 and may have a thickness d3 of approximately 50 to 120 nm. Since it is difficult for the first dielectric layer 132 to adjust the difference between phases of reflected light to be 180 degrees at all wavelengths of ambient light, the second dielectric layer 134 may correct the deviation of the difference between the phases of the reflected light from 180 degrees according to wavelengths of the ambient light.

In some embodiments, the blocking layers 135 correspond respectively to the non-pixel regions NPX and are located closest to the encapsulation member 120. In some embodiments, the blocking layers 135 may be formed between the encapsulation member 120 and the first metal-containing layer 131 to correspond to the non-pixel regions NPX of the display substrate 110. In some embodiments, the blocking layers 135 may be formed of any one of Cr, Mo, Al, Ag, Ti, carbon black and CuO. In some embodiments, the blocking layers 135 may have a thickness that does not allow ambient light incident from outside the destructive interference unit 130 to reach the light-emitting layers 111, for example, a thickness d4 of approximately 50 nm or more.

In some embodiments, the destructive interference unit 130 may cause the first reflected light ① and the second reflected light ② to have a phase difference of approximately 180, such that the first reflected light ① and the second reflected light ② can disappear by destructively interfering with each other. Specifically, the phase of the first reflected light ① may be changed from the phase of the ambient light by approximately 180 degrees as the ambient light incident from outside the destructive interference unit 130 passes through the second dielectric layer 134 and is reflected from the top surface of the second metal-containing layer 133. In some embodiments, the phase of the second reflect light ② may be changed from the phase of the ambient light by a total of approximately 360 degrees, specially may be changed by approximately 90 degrees as the ambient light incident from outside the destructive interference unit 130 passes through the second metal-containing layer 133 and the first dielectric layer 132 after transmitting through the second dielectric layer 134, may be changed by approximately 180 degrees as the ambient light is reflected from the top surface of the first metal-containing layer 131, and may be changed by approximately 90 degrees as the ambient light passes through the first dielectric layer 132 and the second metal-containing layer 133. Therefore, the destructive interference unit 130 can replace a circular polarizer used to reduce reflectance of ambient light.

In some embodiments, the destructive interference unit 130 may have a total thickness of approximately 282.7 nm by including the first metal-containing layer 131 with a thickness of approximately 4.97 nm, the first dielectric layer 132 with a thickness of approximately 82.72 nm, the second metal-containing layer 133 with a thickness of approximately 4.97 nm, the second dielectric layer 134 with a thickness of approximately 90 nm, and the blocking layers 135 with a thickness of approximately 100 nm. Accordingly, the destructive interference unit 130 can realize a thinner light-emitting display device than when a circular polarizer having a total thickness of approximately 150 μm is used.

In some embodiments, the first metal-containing layer 131, the first dielectric layer 132, the second metal-containing layer 133, the second dielectric layer 134 and the blocking layers 135 of the destructive interference unit 130 can be formed using a coating method. Thus, the process of fabricating the light-emitting display device 100 can be simplified compared with when a circular polarizer formed by laminating a number of films is used.

The light-transmitting portions LTP1 and the light-blocking portions LBP1 will now be described in detail.

Figure 3:
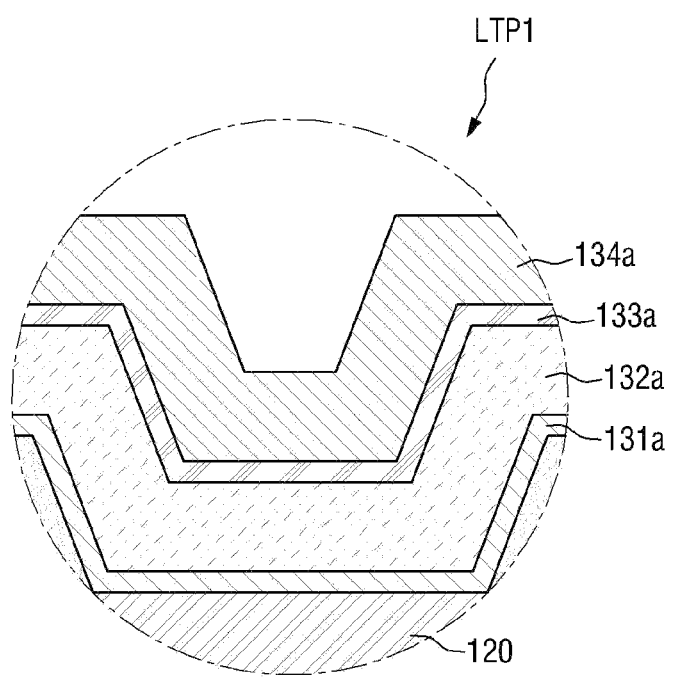
FIG. 3 is an enlarged cross-sectional view of a light-transmitting portion of a destructive interference unit shown in FIG. 1.
Figure 4:
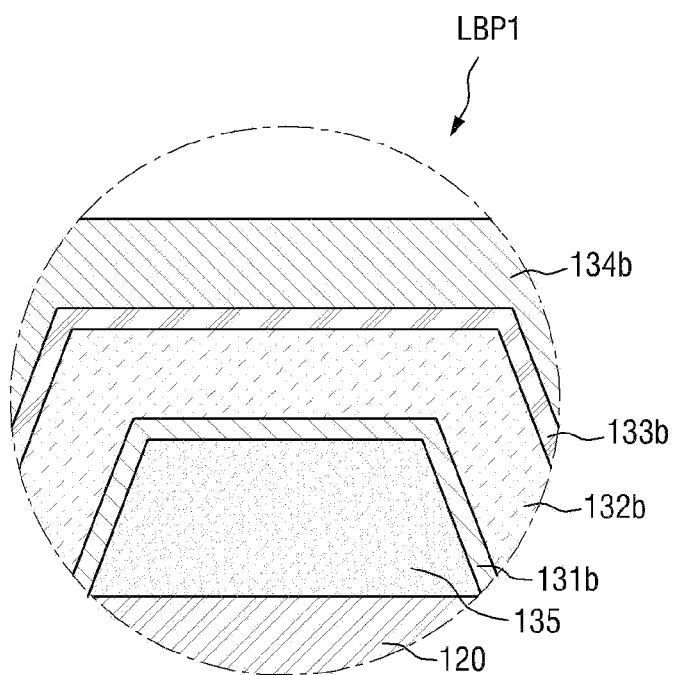
FIG. 4 is an enlarged cross-sectional view of a light-blocking portion of the destructive interference unit shown in FIG. 1.

FIG. 3 is an enlarged cross-sectional view of a light-transmitting portion LTP1 of the destructive interference unit 130 shown in FIG. 1. FIG. 4 is an enlarged cross-sectional view of a light-blocking portion LBP1 of the destructive interference unit 130 shown in FIG. 1.

Referring to FIG. 3, the light-transmitting portion LTP1 includes a first light-transmitting metal-containing layer 131a formed on the encapsulation member 120, a first light-transmitting dielectric layer 132a formed on the first light-transmitting metal-containing layer 131a, a second light-transmitting metal-containing layer 133a formed on the first light-transmitting dielectric layer 132a, and a second light-transmitting dielectric layer 134a formed on the second light-transmitting metal-containing layer 133a.

In some embodiments, the first light-transmitting metal-containing layer 131a, the first light-transmitting dielectric layer 132a, the second light-transmitting metal-containing layer 133a and the second light-transmitting dielectric layer 134a respectively are portions of the first metal-containing layer 131, the first dielectric layer 132, the second metal-containing layer 133 and the second dielectric layer 134 of FIG. 1 which correspond to each of the pixel regions PX of the display substrate 110. In some embodiments, the materials and thicknesses of the first light-transmitting metal-containing layer 131a, the first light-transmitting dielectric layer 132a, the second light-transmitting metal-containing layer 133a, and the second light-transmitting dielectric layer 134a are the same as the materials and thicknesses of the first metal-containing layer 131, the first dielectric layer 132, the second metal-containing layer 133, and the second dielectric layer 134 of FIG. 1, respectively.

Referring to FIG. 4, the light-blocking portion LBP1 includes a first light-blocking metal-containing layer 131b formed on the encapsulation member 120 with a gap therebetween, a first light-blocking dielectric layer 132b formed on the first light-blocking metal-containing layer 131b, a second light-blocking metal-containing layer 133b formed on the first light-blocking dielectric layer 132b, a second light-blocking dielectric layer 134b formed on the second light-blocking metal-containing layer 133b, and a blocking layer 135 interposed between the encapsulation member 120 and the first light-blocking metal-containing layer 131b.

In some embodiments, the first light-blocking metal-containing layer 131b, the first light-blocking dielectric layer 132b, the second light-blocking metal-containing layer 133b and the second light-blocking dielectric layer 134b respectively are portions of the first metal-containing layer 131, the first dielectric layer 132, the second metal-containing layer 133, and the second dielectric layer 134 of FIG. 1 which correspond to each of the non-pixel regions NPX of the display substrate 110. Accordingly, the materials and thicknesses of the first light-blocking metal-containing layer 131b, the first light-blocking dielectric layer 132b, the second light-blocking metal-containing layer 133b and the second light-blocking dielectric layer 134b are the same as the materials and thicknesses of the first metal-containing layer 131, the first dielectric layer 132, the second metal-containing layer 133 and the second dielectric layer 134 of FIG. 1, respectively.

In some embodiments, the blocking layer 135 disposed on the top surface of the encapsulation member 120 may be located at a position corresponding to each of the non-pixel regions NPX of the display substrate 110. Thus, the blocking layer 135 may protrude from the top surface of the encapsulation member 120.

As described above, the first light-transmitting metal-containing layer 131a, the first light-transmitting dielectric layer 132a, the second light-transmitting metal-containing layer 133a and the second light-transmitting dielectric layer 134a as well as the first light-blocking metal-containing layer 131b, the first light-blocking dielectric layer 132b, the second light-blocking metal-containing layer 133b and the second light-blocking dielectric layer 134b are portions of the first metal-containing layer 131, the first dielectric layer 132, the second metal-containing layer 133 and the second dielectric layer 134 of FIG. 1, respectively. In some embodiments, the first light-transmitting metal-containing layer 131a, the first light-transmitting dielectric layer 132a, the second light-transmitting metal-containing layer 133a, and the second light-transmitting dielectric layer 134a may have the same thicknesses as and may be formed of the same materials as the first light-blocking metal-containing layer 131b, the first light-blocking dielectric layer 132b, the second light-blocking metal-containing layer 133b, and the second light-blocking dielectric layer 134b, respectively. However, the total thickness of the light-blocking portion LBP1 is greater than that of the light-transmitting portion LTP1 due to the blocking layer 135.

Ambient light reflectance of a conventional light-emitting display device having a circular polarizing layer and ambient light reflectance of the light-emitting display device 100 according to the embodiment of FIG. 1 having a destructive interference unit will now be described by analysis of experimental results.

Figure 5:
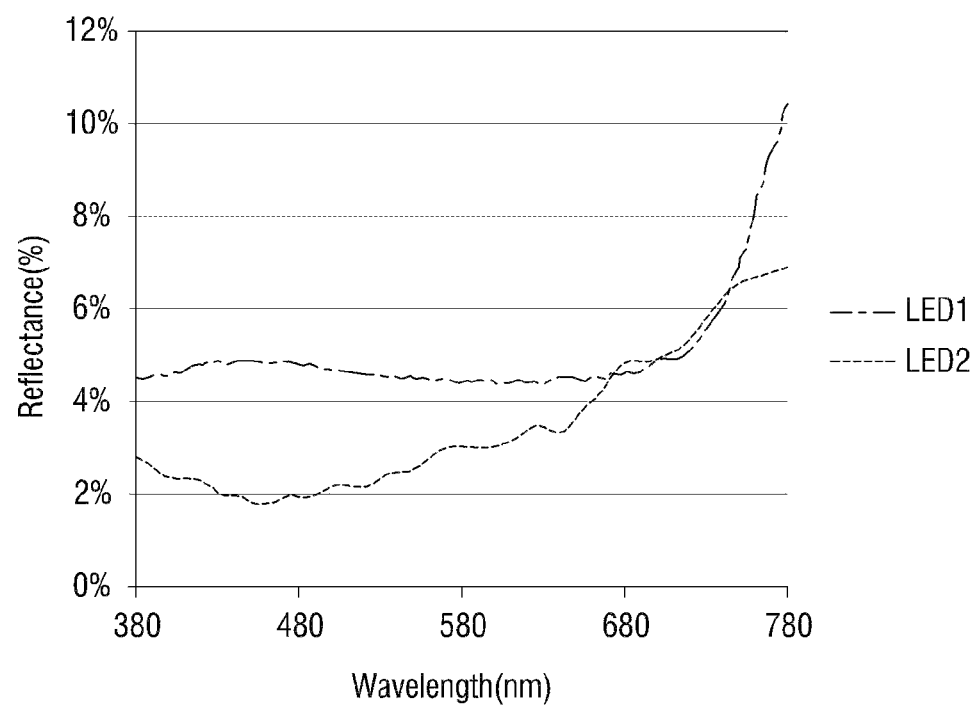
FIG. 5 is a graph comparing ambient light reflectance of a conventional light-emitting display device having a circular polarizer with ambient light reflectance of the light-emitting display device according to the embodiment of FIG. 1.

FIG. 5 is a graph comparing ambient light reflectance of a conventional light-emitting display device having a circular polarizer with ambient light reflectance of the light-emitting display device 100 according to the embodiment of FIG. 1 having a destructive interference unit. In FIG. 5, an organic light-emitting display device functions as a light-emitting display device.

Referring to FIG. 5, ambient light reflectance of the light-emitting display device LED2 (100 in FIG. 1) according to the embodiment of FIG. 1 having a destructive interference unit is lower across all wavelengths than ambient light reflectance of a conventional light-emitting display device LED1 having a circular polarizing layer. In addition, luminous reflectance of the conventional light-emitting display device LED1 having the circular polarizing layer was measured to be 4.6%, and luminous reflectance of the light-emitting display device LED2 according to the embodiment of FIG. 1 having a destructive interference unit was measured to be 2.7%. The above results demonstrate that the destructive interference unit 130 disposed on the encapsulation member 120 in the light-emitting display device 100 according to the embodiment of FIG. 1 can significantly improve contrast by replacing the circular polarizer.

Transmittance of a circular polarizing layer in a conventional light-emitting display device and transmittance of the destructive interference unit 130 in the light-emitting display device 100 according to the embodiment of FIG. 1 will now be described by analysis of experimental results.

Figure 6:
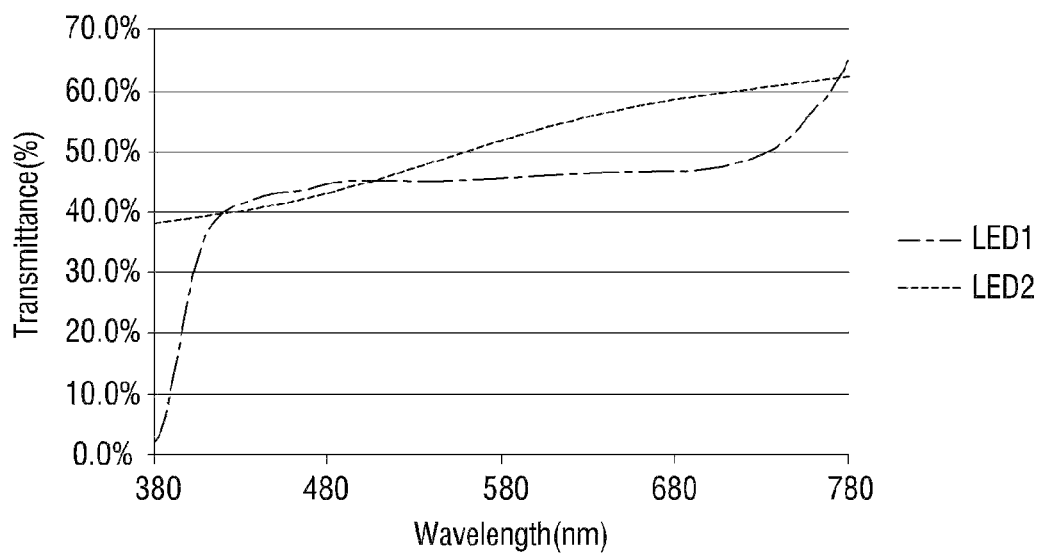
FIG. 6 is a graph comparing transmittance of a circular polarizer in a conventional light-emitting display device with transmittance of the destructive interference unit in the light-emitting display device according to the embodiment of FIG. 1.

FIG. 6 is a graph comparing transmittance of a circular polarizer in a conventional light-emitting display device with transmittance of the destructive interference unit 130 in the light-emitting display device 100 according to the embodiment of FIG. 1. In FIG. 6, an organic light-emitting display device functions as a light-emitting display device.

Referring to FIG. 6, transmittance of the destructive interference unit 130 in the light-emitting display device LED2 (100 in FIG. 1) according to the embodiment of FIG. 1 is higher across all wavelengths than transmittance of a circular polarizing layer in a conventional light-emitting display device LED1. The above results demonstrate that the destructive interference unit 130 disposed on the encapsulation member 120 in the light-emitting display device 100 according to the embodiment of FIG. 1 can improve emission efficiency of light emitted from the light-emitting layers 111.

As described above, the light-emitting display device 100 according to the embodiment of FIG. 1 has the destructive interference unit 130 including a plurality of metal-containing layers (131, 133) and a plurality of dielectric layers (132, 134), which are alternately stacked on the encapsulation member 120, and the blocking layers 135. In some embodiments, the destructive interference unit 130 can replace a circular polarizing film, reduce reflectance of ambient light, reduce a thickness of the light-emitting display device 100, and simplify the process of fabricating the light-emitting display device 100.

A method of fabricating a light-emitting display device according to an embodiment of the present disclosure will now be described.

Figure 7:
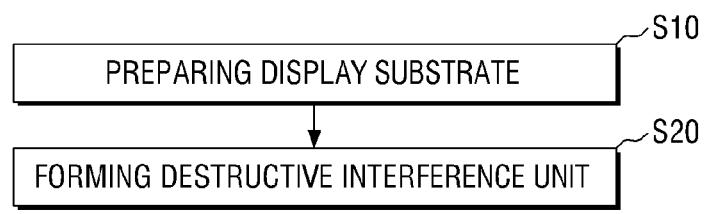
FIG. 7 is a flowchart illustrating a method of fabricating a light-emitting display device according to an embodiment of the present disclosure.

FIG. 7 is a flowchart illustrating a method of fabricating a light-emitting display device according to an embodiment of the present disclosure. FIGS. 8 through 14 are cross-sectional views illustrating the fabrication method of FIG. 7.

Referring to FIG. 7, a method of fabricating the light-emitting display device according to some embodiments may include preparing a display substrate (operation S10) and forming a destructive interference unit (operation S20).

Figure 8:
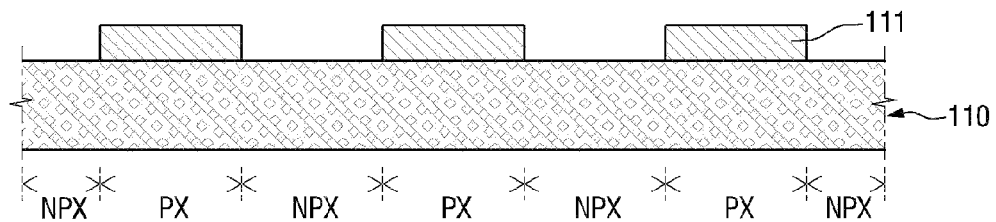
FIGS. 8 through 14 are cross-sectional views illustrating the fabrication method of FIG. 7.

Referring to FIG. 8, in the preparing of the display substrate (operation S10), a display substrate 110 including pixel regions PX and non-pixel regions NPX is prepared. In some embodiments, the display substrate 110 may include light-emitting layers 111 formed on the pixel regions PX. Since the display substrate 110 has been described above in detail, a redundant description thereof will be omitted.

Referring to FIGS. 9 through 14, during preparation of the destructive interference unit (operation S20), a destructive interference unit 130 including a plurality of metal-containing layers (131, 133) and a plurality of dielectric layers (132, 134) which are alternately stacked on an encapsulation member 120 and further including blocking layers 135 which correspond to the non-pixel regions NPX and are located closest to the encapsulation member 120 is formed. Specifically, a first metal-containing layer 131, a first dielectric layer 132, a second metal-containing layer 133, a second dielectric layer 134, and the blocking layers 135 are formed on the encapsulation member 120.

Figure 9:
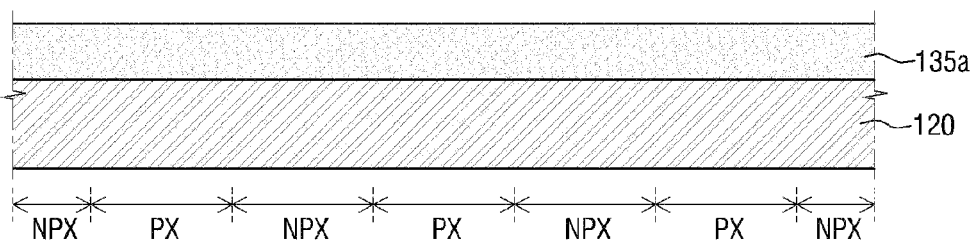

Referring to FIG. 9, a blocking material 135a is applied onto the encapsulation member 120.

Figure 10:
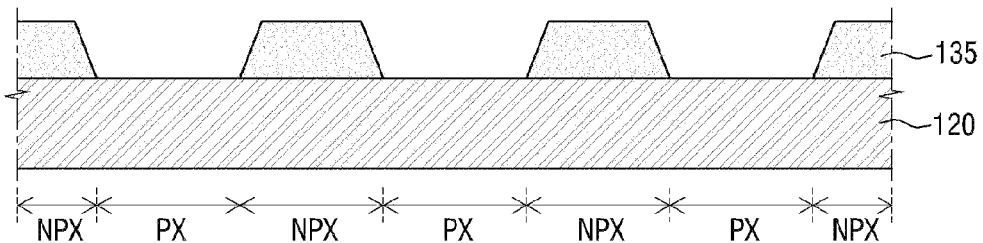

Referring to FIG. 10, the blocking material 135a is patterned using a photolithography method, thereby forming the blocking layers 135 on regions of the encapsulation member 120 which correspond to the non-pixel regions NPX of the display substrate 110. Since the material and thickness of the blocking layers 135 have been described above, a redundant description thereof will be omitted.

Figure 11:
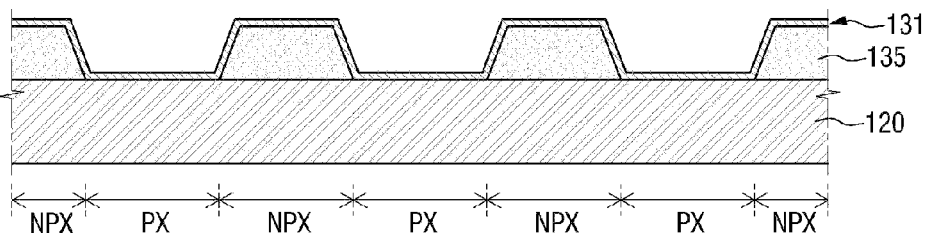

Referring to FIG. 11, a first metal-containing material is applied to the whole top surface of the encapsulation member 120 to cover the blocking layers 135, thereby forming the first metal-containing layer 131. In some embodiments, the applying of the first metal-containing material may be accomplished by a deposition method, a coating method, a printing method, etc. Since the material and thickness of the first metal-containing layer 131 have been described above, a redundant description thereof will be omitted.

Figure 12:
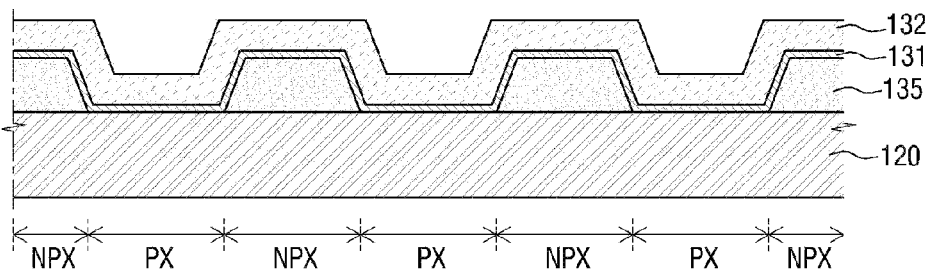

Referring to FIG. 12, a first dielectric material is applied to the whole top surface of the first metal-containing layer 131, thereby forming the first dielectric layer 132. In some embodiments, the applying of the first dielectric material may be accomplished by a deposition method, a coating method, a printing method, etc. Since the material and thickness of the first dielectric layer 132 have been described above, a redundant description thereof will be omitted.

Figure 13:
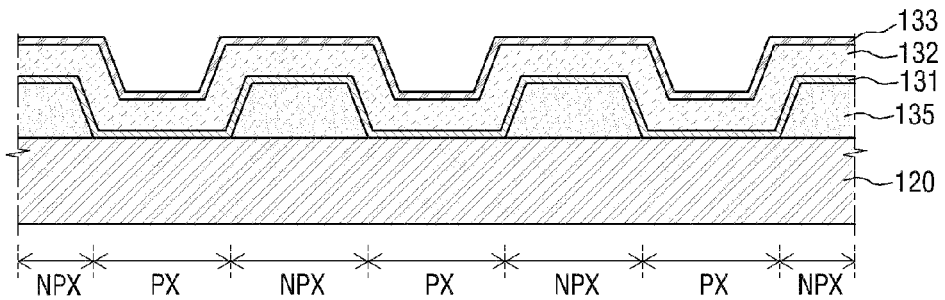

Referring to FIG. 13, a second metal-containing material is applied to the whole top surface of the first dielectric layer 132, thereby forming the second metal-containing layer 133. In some embodiments, the applying of the second metal-containing material may be accomplished by a deposition method, a coating method, a printing method, etc. Since the material and thickness of the second metal-containing layer 133 have been described above, a redundant description thereof will be omitted.

Figure 14:
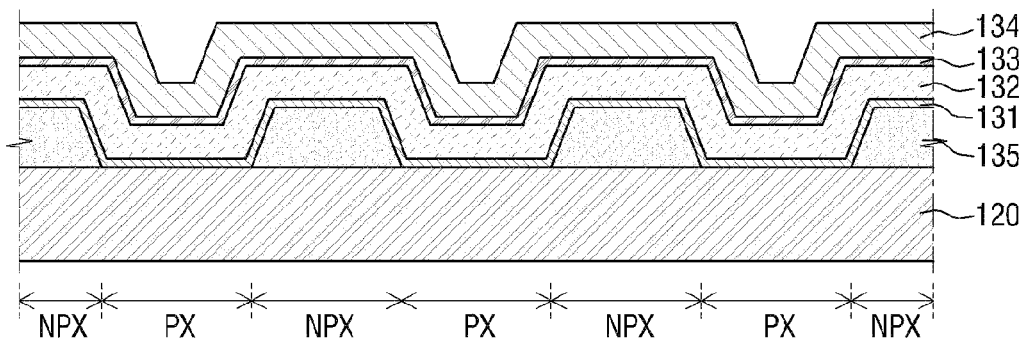

Referring to FIG. 14, a second dielectric material is applied to the whole top surface of the second metal-containing layer 133, thereby forming the second dielectric layer 134. The applying of the second dielectric material may be accomplished by a deposition method, a coating method, a printing method, etc. Since the material and thickness of the second dielectric layer 134 have been described above, a redundant description thereof will be omitted.

Although not shown in the drawings, coupling the display substrate 110 and the encapsulation member 120 may be performed after the forming of the destructive interference unit (operation S20). In some embodiments, if the encapsulation member 120 is formed as an encapsulation film, the coupling of the display substrate 110 and the encapsulation member 120 may be omitted.

A light-emitting display device according to another embodiment of the present disclosure will now be described.

Figure 15:
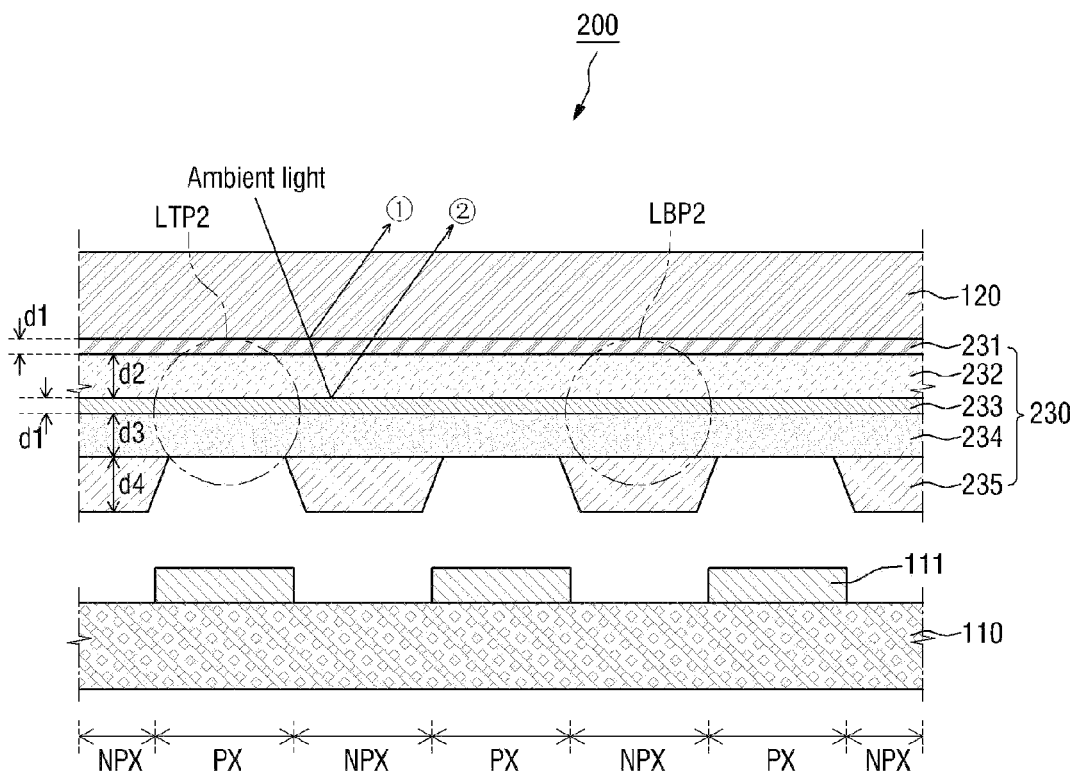
FIG. 15 is a cross-sectional view of a light-emitting display device according to another embodiment of the present disclosure.

FIG. 15 is a cross-sectional view of a light-emitting display device 200 according to another embodiment of the present disclosure.

In some embodiments, the light-emitting display device 200 has the same configuration as the light-emitting display device 100 of FIG. 1 except for having a destructive interference unit 230. Therefore, the light-emitting display device 200 according to the current embodiment will be described, focusing mainly on the destructive interference unit 230.

Referring to FIG. 15, the light-emitting display device 200 according to the current embodiment includes a display substrate 110, an encapsulation member 120, and the destructive interference unit 230.

In some embodiments, the destructive interference unit 230 may be formed on the encapsulation member 120 and may be disposed at the lower part of the encapsulation member 120. Like the destructive interference unit 130 of FIG. 1, the destructive interference unit 230 broadly includes light-transmitting portions LTP2 corresponding to pixel regions PX of the display substrate 110 and light-blocking portions LBP2 corresponding to non-pixel regions NPX of the display substrate 110.

In some embodiments, the light-transmitting portions LTP2 and the light-blocking portions LBP2 play the same roles as the light-transmitting portions LTP1 and the light-blocking portions LBP1 of FIG. 1. The light-transmitting portions LTP2 and the light-blocking portions LBP2 will be described in detail later.

In some embodiments, the destructive interference unit 230 may include a plurality of metal-containing layers (231, 233) and a plurality of dielectric layers (232, 234), which are stacked alternately on the encapsulation member 120, and blocking layers 235. For example, the destructive interference unit 230 may include a first metal-containing layer 231, a first dielectric layer 232, a second metal-containing layer 233, a second dielectric layer 234, and the blocking layers 235.

In some embodiments, the first metal-containing layer 231 may be formed on the encapsulation member 120. In some embodiments, the first metal-containing layer 231 may contact the bottom surface of the encapsulation member 120. In some embodiments, the first metal-containing layer 231 is similar to the second metal-containing layer 133 of FIG. 1 and may be formed of the material that forms the second metal-containing layer 133 of FIG. 1. Like the second metal-containing layer 133 of FIG. 1, the first metal-containing layer 231 may have a thickness d1 that satisfies Equation (1).

In some embodiments, the first dielectric layer 232 may be formed on the first metal-containing layer 231. In some embodiments, the first dielectric layer 232 may contact a bottom surface of the first metal-containing layer 231. In some embodiments, the first dielectric layer 232 is similar to the first dielectric layer 132 of FIG. 1 and may be formed of the material that forms the first dielectric layer 132 of FIG. 1. Like the first dielectric layer 132 of FIG. 1, the first dielectric layer 232 may have a thickness d2 that satisfies Equation (2). In some embodiments, the first dielectric layer 232 may adjust a difference between a phase of a first reflected light ① which ambient light is reflected from a top surface of the first metal-containing layer 231 and a phase of a second reflected light ② which the ambient light transmits through the first metal-containing layer 231 and the first dielectric layer 232 to be reflected from a top surface of the second metal-containing layer 233 and then transmits through the first dielectric layer 232 and the first metal-containing layer 231 to emerge from the top surface of the first metal-containing layer 231 to be approximately 180 degrees, so that the ambient light reflected from the destructive interference unit 230 can be offset.

In some embodiments, the second metal-containing layer 233 is formed on the first dielectric layer 232. In some embodiments, the second metal-containing layer 233 may contact a bottom surface of the first dielectric layer 232. In some embodiments, the second metal-containing layer 233 is similar to the first metal-containing layer 131 of FIG. 1 and may be formed of the material that forms the first metal-containing layer 131 of FIG. 1. Like the first metal-containing layer 131 of FIG. 1, the second metal-containing layer 233 may have a thickness d1 that satisfies Equation (1).

In some embodiments, the second dielectric layer 234 may be formed on the second metal-containing layer 233. In some embodiments, the second dielectric layer 234 may contact a bottom surface of the second metal-containing layer 233. In some embodiments, the second dielectric layer 234 is similar to the second dielectric layer 134 of FIG. 1, may be formed of the material that forms the second dielectric layer 134 of FIG. 1, and may have a thickness d3 of approximately 50 nm to 120 nm.

In some embodiments, the blocking layers 235 correspond respectively to the non-pixel regions NPX and are located farthest from the encapsulation member 120. That is, the blocking layers 235 are disposed on the second dielectric layer 234, specifically, contact a bottom surface of the second dielectric layer 234 and are located at positions corresponding to the non-pixel regions NPX of the display substrate 110. In some embodiments, the blocking layers 235 are similar to the blocking layers 135 of FIG. 1 and may be formed of the material that forms the blocking layers 135 of FIG. 1. Like the blocking layers 135 of FIG. 1, the blocking layers 235 may have a thickness of approximately 50 nm or more.

As described above, the destructive interference unit 230 may cause the first reflected light ① and the second reflected light ② to have a phase difference of approximately 180, such that the first reflected light ① and the second reflected light ② can disappear by destructively interfering with each other. Specifically, the phase of the first reflected light ① may be changed from the phase of the ambient light by approximately 180 degrees as the ambient light incident from outside the destructive interference unit 230 is reflected from the top surface of the first metal-containing layer 231. In some embodiments, the phase of the second reflect light ② may be changed from the phase of the ambient light by a total of approximately 360 degrees, specially may be changed by approximately 90 degrees as the ambient light incident from outside the destructive interference unit 230 passes through the first dielectric layer 232 after transmitting through the first metal-containing layer 231, may be changed by approximately 180 degrees as the ambient light is reflected from the top surface of the second metal-containing layer 233, and may be changed by approximately 90 degrees as the ambient light passes through the first dielectric layer 232 and the first metal-containing layer 231. Therefore, the destructive interference unit 230 can replace a circular polarizer used to reduce reflectance of ambient light.

In some embodiments, the destructive interference unit 230 may have a total thickness of approximately 282.7 nm by including the first metal-containing layer 231 with a thickness of approximately 4.97 nm, the first dielectric layer 232 with a thickness of approximately 82.72 nm, the second metal-containing layer 233 with a thickness of approximately 4.97 nm, the second dielectric layer 234 with a thickness of approximately 90 nm, and the blocking layers 235 with a thickness d4 of approximately 100 nm. Accordingly, the destructive interference unit 230 can realize a thinner light-emitting display device than when a circular polarizer having a total thickness of approximately 150 µm is used.

In some embodiments, the first metal-containing layer 231, the first dielectric layer 232, the second metal-containing layer 233, the second dielectric layer 234 and the blocking layers 235 of the destructive interference unit 230 can be formed using a coating method. Thus, the process of fabricating the light-emitting display device 200 can be simplified compared with when a circular polarizer formed by laminating a number of films is used.

The light-transmitting portions LTP2 and the light-blocking portions LBP2 will now be described in detail.

Figure 16:
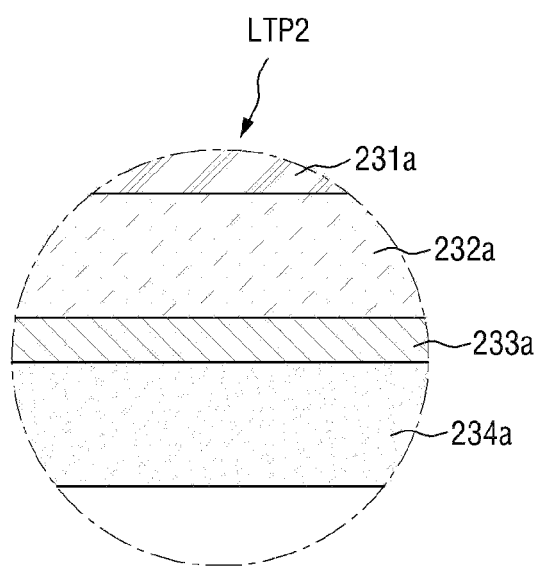
FIG. 16 is an enlarged cross-sectional view of a light-transmitting portion of a destructive interference unit shown in FIG. 15.
Figure 17:
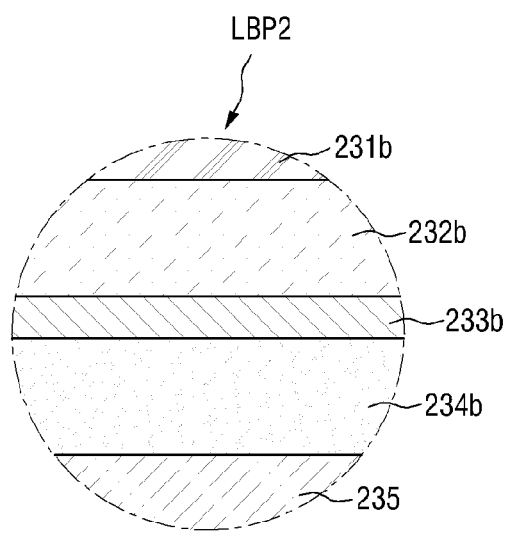
FIG. 17 is an enlarged cross-sectional view of a light-blocking portion of the destructive interference unit shown in FIG. 15.

FIG. 16 is an enlarged cross-sectional view of a light-transmitting portion LTP2 of the destructive interference unit 230 shown in FIG. 15. FIG. 17 is an enlarged cross-sectional view of a light-blocking portion LBP2 of the destructive interference unit 230 shown in FIG. 15.

Referring to FIG. 16, the light-transmitting portion LTP2 includes a first light-transmitting metal-containing layer 231a formed on the encapsulation member 120, a first light-transmitting dielectric layer 232a formed on the first light-transmitting metal-containing layer 231a, a second light-transmitting metal-containing layer 233a formed on the first light-transmitting dielectric layer 232a, and a second light-transmitting dielectric layer 234a formed on the second light-transmitting metal-containing layer 233a.

In some embodiments, the first light-transmitting metal-containing layer 231a, the first light-transmitting dielectric layer 232a, the second light-transmitting metal-containing layer 233a and the second light-transmitting dielectric layer 234a respectively are portions of the first metal-containing layer 231, the first dielectric layer 232, the second metal-containing layer 233 and the second dielectric layer 234 of FIG. 15 which correspond to each of the pixel regions PX of the display substrate 110. Accordingly, the materials and thicknesses of the first light-transmitting metal-containing layer 231a, the first light-transmitting dielectric layer 232a, the second light-transmitting metal-containing layer 233a, and the second light-transmitting dielectric layer 234a are the same as the materials and thicknesses of the first metal-containing layer 231, the first dielectric layer 232, the second metal-containing layer 233, and the second dielectric layer 234 of FIG. 15, respectively.

Referring to FIG. 17, the light-blocking portion LBP2 includes a first light-blocking metal-containing layer 231b formed on the encapsulation member 120, a first light-blocking dielectric layer 232b formed on the first light-blocking metal-containing layer 231b, a second light-blocking metal-containing layer 233b formed on the first light-blocking dielectric layer 232b, a second light-blocking dielectric layer 234b formed on the second light-blocking metal-containing layer 233b, and a blocking layer 235 formed on the second light-blocking dielectric layer 234b.

In some embodiments, the first light-blocking metal-containing layer 231b, the first light-blocking dielectric layer 232b, the second light-blocking metal-containing layer 233b and the second light-blocking dielectric layer 234b respectively are portions of the first metal-containing layer 231, the first dielectric layer 232, the second metal-containing layer 233, and the second dielectric layer 234 of FIG. 15 which correspond to each of the non-pixel regions NPX of the display substrate 110. Accordingly, the materials and thicknesses of the first light-blocking metal-containing layer 231b, the first light-blocking dielectric layer 232b, the second light-blocking metal-containing layer 233b and the second light-blocking dielectric layer 234b are the same as the materials and thicknesses of the first metal-containing layer 231, the first dielectric layer 232, the second metal-containing layer 233 and the second dielectric layer 234 of FIG. 15, respectively.

In some embodiments, the blocking layer 235 disposed on the bottom surface of the encapsulation member 120 is located at a position corresponding to each of the non-pixel regions NPX of the display substrate 110. Thus, the blocking layer 135 may protrude from the bottom surface of the encapsulation member 120.

As described above, the first light-transmitting metal-containing layer 231a, the first light-transmitting dielectric layer 232a, the second light-transmitting metal-containing layer 233a and the second light-transmitting dielectric layer 234a as well as the first light-blocking metal-containing layer 231b, the first light-blocking dielectric layer 232b, the second light-blocking metal-containing layer 233b and the second light-blocking dielectric layer 234b are portions of the first metal-containing layer 231, the first dielectric layer 232, the second metal-containing layer 233 and the second dielectric layer 234 of FIG. 15, respectively. Therefore, the first light-transmitting metal-containing layer 231a, the first light-transmitting dielectric layer 232a, the second light-transmitting metal-containing layer 233a, and the second light-transmitting dielectric layer 234a may have the same thicknesses as and may be formed of the same materials as the first light-blocking metal-containing layer 231b, the first light-blocking dielectric layer 232b, the second light-blocking metal-containing layer 233b, and the second light-blocking dielectric layer 234b, respectively. However, the total thickness of the light-blocking portion LBP2 is greater than that of the light-transmitting portion LTP2 due to inclusion of the blocking layer 235.

Ambient light reflectance of a conventional light-emitting display device having a circular polarizing layer and ambient light reflectance of the light-emitting display device 200 having a destructive interference unit according to the embodiment of FIG. 15 will now be described by analysis of experimental results.

Figure 18:
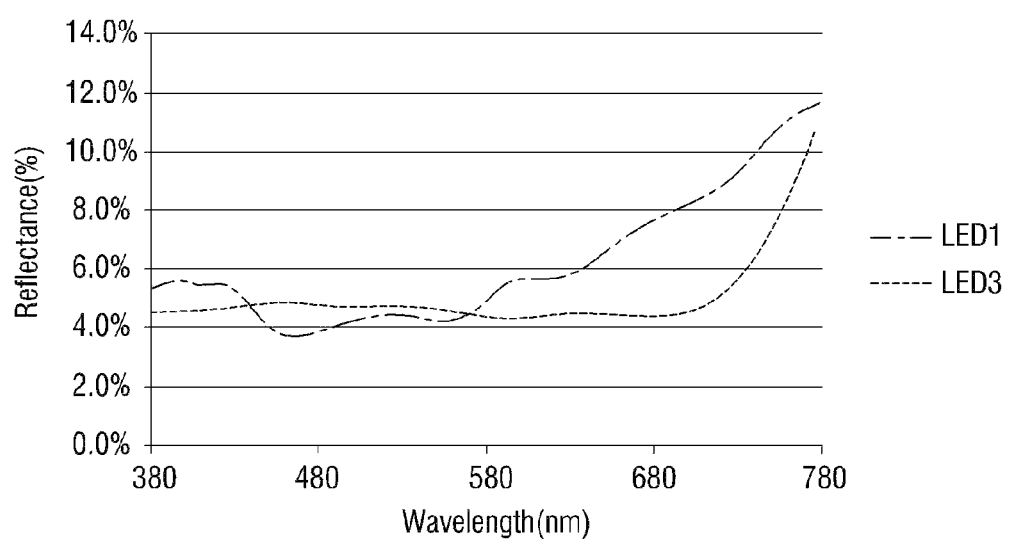
FIG. 18 is a graph comparing ambient light reflectance of a conventional light-emitting display device having a circular polarizer with ambient light reflectance of the light-emitting display device according to the embodiment of FIG. 15.

FIG. 18 is a graph comparing ambient light reflectance of a conventional light-emitting display device having a circular polarizer with ambient light reflectance of the light-emitting display device 200 according to the embodiment of FIG. 15 having a destructive interference unit. In FIG. 18, an organic light-emitting display device was used as a light-emitting display device.

Referring to FIG. 18, ambient light reflectance of the light-emitting display device LED3 (200 in FIG. 15) according to the embodiment of FIG. 15 is lower across all wavelengths than ambient light reflectance of a conventional light-emitting display device LED1 having a circular polarizing layer. In addition, luminous reflectance of the conventional light-emitting display device LED1 having the circular polarizing layer was measured to be 4.6%, and luminous reflectance of the light-emitting display device LED3 according to the embodiment of FIG. 15 having a destructive interference unit was measured to be 4.5%. The above results demonstrate that the destructive interference unit 230 disposed on the encapsulation member 120 in the light-emitting display device 200 according to the embodiment of FIG. 15 can significantly improve contrast by replacing the circular polarizer.

Transmittance of a circular polarizing layer in a conventional light-emitting display device and transmittance of the destructive interference unit 230 in the light-emitting display device 200 according to the embodiment of FIG. 15 having a destructive interference unit will now be described by analysis of experiment al results.

Figure 19:
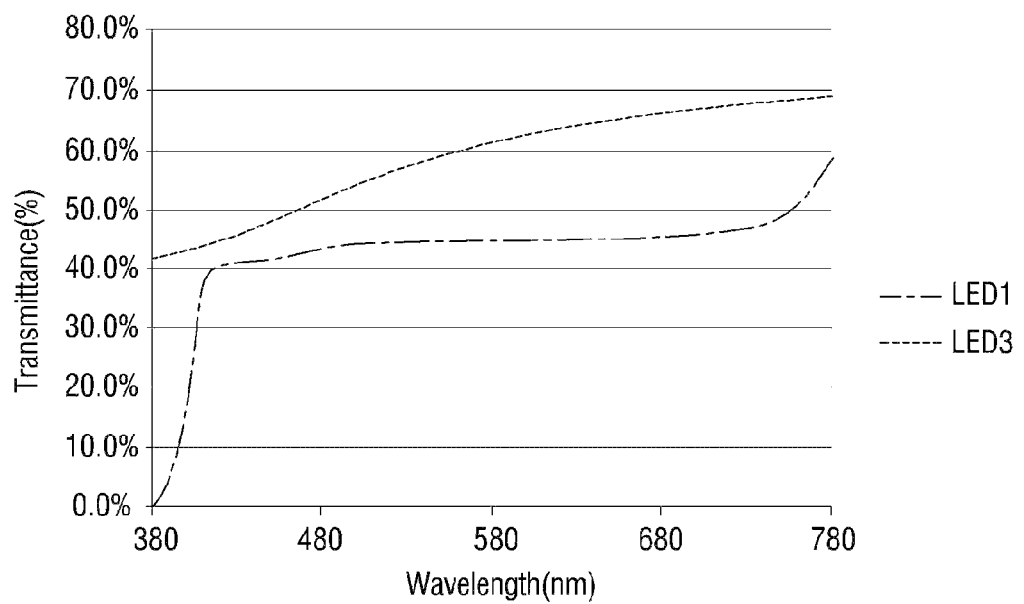
FIG. 19 is a graph comparing transmittance of a circular polarizer in a conventional light-emitting display device with transmittance of the destructive interference unit in the light-emitting display device according to the embodiment of FIG. 15.

FIG. 19 is a graph comparing transmittance of a circular polarizing layer in a conventional light-emitting display device with transmittance of the destructive interference unit 230 in the light-emitting display device 200 according to the embodiment of FIG. 15. In FIG. 19, the organic light-emitting display device functions as a light-emitting display device.

Referring to FIG. 19, transmittance of the destructive interference unit 230 (see FIG. 15) in the light-emitting display device LED3 (200 in FIG. 15) according to the embodiment of FIG. 15 is higher across all wavelengths than transmittance of a circular polarizing layer in a conventional light-emitting display device LED1. The above results demonstrate that the destructive interference unit 230 disposed on the encapsulation member 120 in the light-emitting display device 200 according to the embodiment of FIG. 15 can improve emission efficiency of light emitted from light-emitting layers 111.

As described above, the light-emitting display device 200 according to the embodiment of FIG. 15 has the destructive interference unit 230 including a plurality of metal-containing layers (231, 233) and a plurality of dielectric layers (232, 234), which are alternately stacked on the encapsulation member 120, and the blocking layers 235. In some embodiments, the destructive interference unit 230 can replace a circular polarizing film, reduce reflectance of ambient light, reduce a thickness of the light-emitting display device 200, and simplify the process of fabricating the light-emitting display device 200.

A method of fabricating a light-emitting display device according to another embodiment of the present disclosure will now be described.

Figure 20:
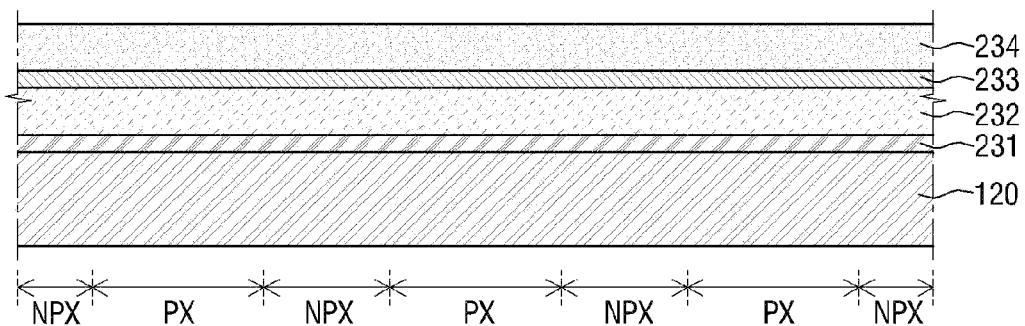
FIGS. 20 through 22 are cross-sectional views illustrating a method of fabricating a light-emitting display device according to another embodiment of the present disclosure.
Figure 21:
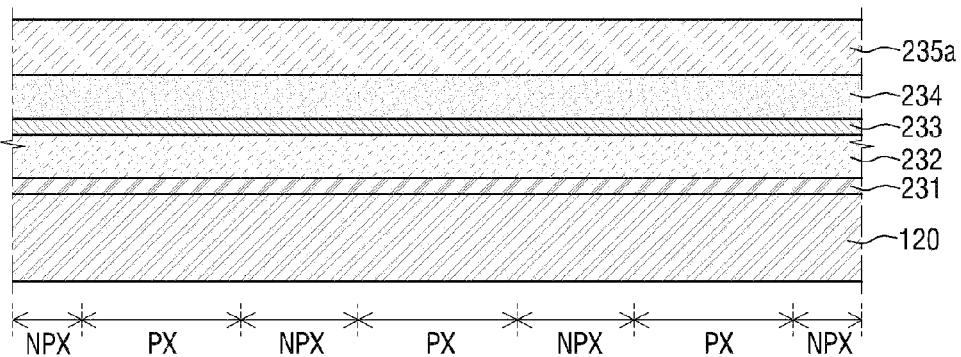
Figure 22:
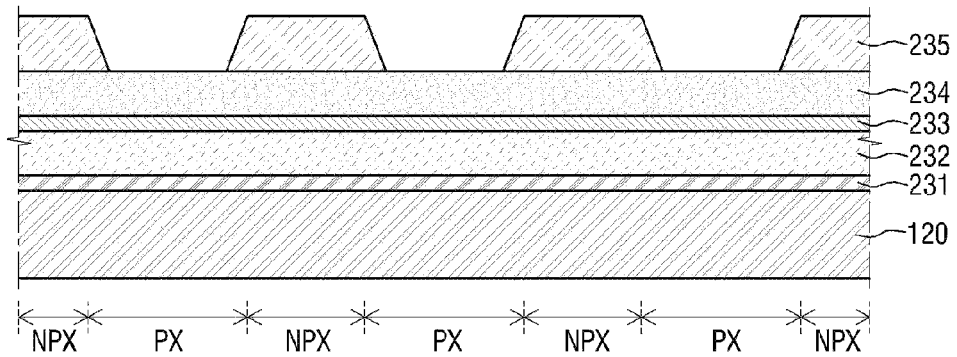

FIGS. 20 through 22 are cross-sectional views illustrating a method of fabricating a light-emitting display device according to another embodiment of the present disclosure.

The method of fabricating the light-emitting display device according to the current embodiment is the same as the method of fabricating the light-emitting display device according to the previous embodiment of FIG. 7, except for forming a destructive interference unit. Accordingly, the method of fabricating the light-emitting display device according to the current embodiment will be described, focusing mainly on the forming of the destructive interference unit.

Referring to FIGS. 20 through 22, during preparation of the destructive interference unit, a destructive interference unit 230 including a plurality of metal-containing layers (231, 233) and a plurality of dielectric layers (232, 234) which are alternately stacked on an encapsulation member 120 and further including blocking layers 235 which correspond to non-pixel regions NPX and are located farthest from the encapsulation member 120 is formed. In some embodiments, a first metal-containing layer 231, a first dielectric layer 232, a second metal-containing layer 233, a second dielectric layer 234, and the blocking layers 235 may be formed on the encapsulation member 120.

Referring to FIG. 20, the first metal-containing layer 231 is formed by applying a first metal-containing material to the whole top surface of the encapsulation member 120, the first dielectric layer 232 is formed by applying a first dielectric material to the whole top surface of the first metal-containing layer 231, the second metal-containing layer 233 is formed by applying a second metal-containing material to the whole top surface of the first dielectric layer 132, and the second dielectric layer 234 is formed by applying a second dielectric material to the whole top surface of the second metal-containing layer 233. Since the material and thickness of the first metal-containing layer 231, the material and thickness of the first dielectric layer 232, the material and thickness of the second metal-containing layer 233, and the material and thickness of the second dielectric layer 234 have been described above, a redundant description thereof will be omitted.

Referring to FIG. 21, a blocking material 235a is applied to the whole top surface of the second dielectric layer 234.

Referring to FIG. 22, the blocking material 235a is patterned using a photolithography method, thereby forming the blocking layers 235 on regions of the encapsulation member 120 which correspond to the non-pixel regions NPX of a display substrate 110. Since the material and thickness of the blocking layers 235 have been described above, a redundant description thereof will be omitted.

Although not shown in the drawings, in some embodiments coupling the display substrate 110 and the encapsulation member 120 may be performed after the forming of the destructive interference unit. In some embodiments, the encapsulation member 120 of FIG. 22 may be turned upside down and then coupled to the display substrate 110.

A light-emitting display device according to another embodiment of the present disclosure will now be described.

Figure 23:
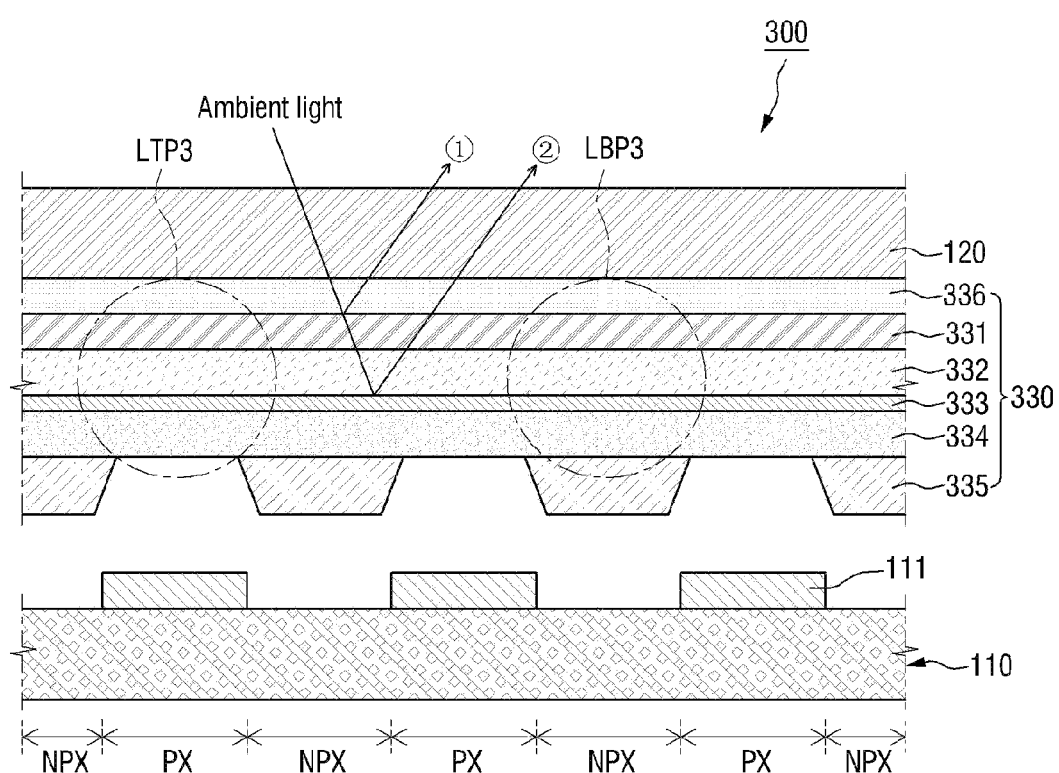
FIG. 23 is a cross-sectional view of a light-emitting display device according to another embodiment of the present disclosure.

FIG. 23 is a cross-sectional view of a light-emitting display device 300 according to another embodiment of the present disclosure.

The light-emitting display device 300 according to the current embodiment has the same configuration as the light-emitting display device 200 of FIG. 15 except for a destructive interference unit 330. Therefore, the light-emitting display device 300 according to the current embodiment will be described, focusing mainly on the destructive interference unit 330.

Referring to FIG. 23, the light-emitting display device 300 according to the current embodiment includes a display substrate 110, an encapsulation member 120, and the destructive interference unit 330.

In some embodiments, the destructive interference unit 330 may be formed on the encapsulation member 120 and may be disposed at the lower part of the encapsulation member 120. Like the destructive interference unit 230 of FIG. 15, the destructive interference unit 330 broadly includes light-transmitting portions LTP3 corresponding to pixel regions PX of the display substrate 110 and light-blocking portions LBP3 corresponding to non-pixel regions NPX of the display substrate 110.

In some embodiments, the light-transmitting portions LTP3 and the light-blocking portions LBP3 play the same roles as the light-transmitting portions LTP2 and the light-blocking portions LBP2 of FIG. 15. The light-transmitting portions LTP3 and the light-blocking portions LBP3 will be described in detail later.

In some embodiments, the destructive interference unit 330 may include a plurality of metal-containing layers (331, 333) and a plurality of dielectric layers (332, 334), which are stacked alternately on the encapsulation member 120, and blocking layers 335. For example, the destructive interference unit 330 may include a first metal-containing layer 331, a first dielectric layer 332, a second metal-containing layer 333, a second dielectric layer 334, the blocking layers 335, and a third dielectric layer 336.

In some embodiments, the first metal-containing layer 331, the first dielectric layer 332, the second metal-containing layer 333, the second dielectric layer 334 and the blocking layers 335 may be the same as the first metal-containing layer 231, the first dielectric layer 232, the second metal-containing layer 233, the second dielectric layer 234 and the blocking layers 235 of FIG. 15.

In some embodiments, the third dielectric layer 336 may be interposed between the encapsulation member 120 and the first metal-containing layer 331. In some embodiments, the third dielectric layer 336 is similar to the second dielectric layer 334, may be formed of the material that forms the second dielectric layer 334, and may have a thickness of approximately 50 to 120 nm. In some embodiments, the third dielectric layer 336 added to the destructive interference unit 330 may correct the deviation of a difference between phases of reflected light from 180 degrees according to wavelengths of ambient light, together with the second dielectric layer 334.

As described above, the destructive interference unit 330 may cause a first reflected light ① and a second reflected light ② to have a phase difference of approximately 180, such that the first reflected light ① and the second reflected light ② can disappear by destructively interfering with each other. Specifically, the phase of the first reflected light ① may be changed from the phase of the ambient light by approximately 180 degrees as the ambient light incident from outside the destructive interference unit 330 is reflected from a top surface of the first metal-containing layer 331. In some embodiments, the phase of the second reflect light ② may be changed from the phase of the ambient light by a total of approximately 360 degrees, specially may be changed by approximately 90 degrees as the ambient light incident from outside the destructive interference unit 330 passes through the first dielectric layer 332 after transmitting through the first metal-containing layer 331, may be changed by approximately 180 degrees as the ambient light is reflected from the top surface of the second metal-containing layer 333, and may be changed by approximately 90 degrees as the ambient light passes through the first dielectric layer 332 and the first metal-containing layer 331. Therefore, the destructive interference unit 330 can replace a circular polarizer used to reduce reflectance of ambient light.

In some embodiments, the destructive interference unit 330 may have a total thickness of approximately 372.7 nm by including the first metal-containing layer 331 with a thickness of approximately 4.97 nm, the first dielectric layer 332 with a thickness of approximately 82.72 nm, the second metal-containing layer 333 with a thickness of approximately 4.97 nm, the second dielectric layer 334 with a thickness of approximately 90 nm, the blocking layers 335 with a thickness of approximately 100 nm, and the third dielectric layer 336 with a thickness of approximately 90 nm. Accordingly, the destructive interference unit 330 can realize a thinner light-emitting display device than when a circular polarizer having a total thickness of approximately 150 μm is used.

In some embodiments, the first metal-containing layer 331, the first dielectric layer 332, the second metal-containing layer 333, the second dielectric layer 334, the blocking layers 335 and the third dielectric layer 336 of the destructive interference unit 330 can be formed using a coating method. Thus, the process of fabricating the light-emitting display device 300 can be simplified compared with when a circular polarizer formed by laminating a number of films is used.

The light-transmitting portions LTP3 and the light-blocking portions LBP3 will now be described in detail.

Figure 24:
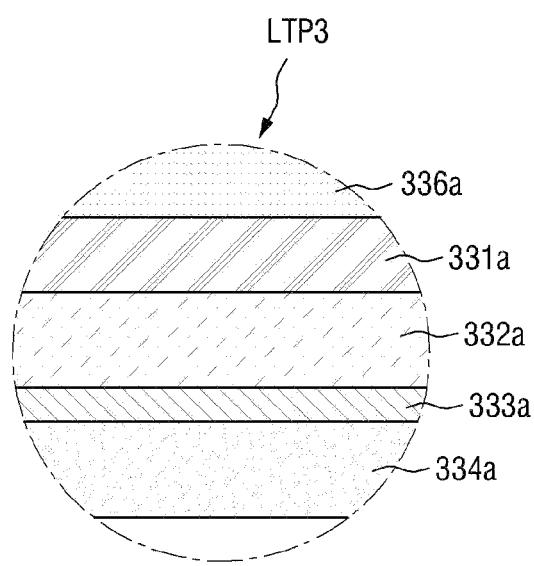
FIG. 24 is an enlarged cross-sectional view of a light-transmitting portion of a destructive interference unit shown in FIG. 23.
Figure 25:
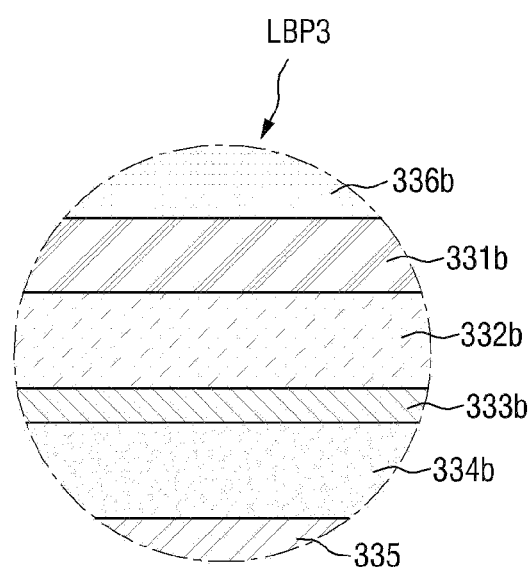
FIG. 25 is an enlarged cross-sectional view of a light-blocking portion of the destructive interference unit shown in FIG. 23.

FIG. 24 is an enlarged cross-sectional view of a light-transmitting portion LTP3 of the destructive interference unit 330 shown in FIG. 23. FIG. 25 is an enlarged cross-sectional view of a light-blocking portion LBP3 of the destructive interference unit 330 shown in FIG. 23.

Referring to FIG. 24, the light-transmitting portion LTP3 includes a first light-transmitting metal-containing layer 331a formed on the encapsulation member 120, a first light-transmitting dielectric layer 332a formed on the first light-transmitting metal-containing layer 331a, a second light-transmitting metal-containing layer 333a formed on the first light-transmitting dielectric layer 332a, a second light-transmitting dielectric layer 334a formed on the second light-transmitting metal-containing layer 333a, and a third light-transmitting dielectric layer 336a interposed between the encapsulation member 120 and the first light-transmitting metal-containing layer 331a.

In some embodiments, the first light-transmitting metal-containing layer 331a, the first light-transmitting dielectric layer 332a, the second light-transmitting metal-containing layer 333a, the second light-transmitting dielectric layer 334a and the third light-transmitting dielectric layer 336a respectively are portions of the first metal-containing layer 331, the first dielectric layer 332, the second metal-containing layer 333, the second dielectric layer 334 and the third dielectric layer 336 of FIG. 23 which correspond to each of the pixel regions PX of the display substrate 110. In some embodiments, the materials and thicknesses of the first light-transmitting metal-containing layer 331a, the first light-transmitting dielectric layer 332a, the second light-transmitting metal-containing layer 333a, the second light-transmitting dielectric layer 334a and the third light-transmitting dielectric layer 336a are the same as the materials and thicknesses of the first metal-containing layer 331, the first dielectric layer 332, the second metal-containing layer 333, the second dielectric layer 334 and the third dielectric layer 336 of FIG. 23, respectively.

Referring to FIG. 25, the light-blocking portion LBP3 includes a first light-blocking metal-containing layer 331b formed on the encapsulation member 120, a first light-blocking dielectric layer 332b formed on the first light-blocking metal-containing layer 331b, a second light-blocking metal-containing layer 333b formed on the first light-blocking dielectric layer 332b, a second light-blocking dielectric layer 334b formed on the second light-blocking metal-containing layer 333b, a blocking layer 335 formed on the second light-blocking dielectric layer 334b, and a third light-blocking dielectric layer 336b interposed between the encapsulation member 120 and the first light-blocking metal-containing layer 331b.

In some embodiments, the first light-blocking metal-containing layer 331b, the first light-blocking dielectric layer 332b, the second light-blocking metal-containing layer 333b, the second light-blocking dielectric layer 334b and the third light-blocking dielectric layer 336b respectively are portions of the first metal-containing layer 331, the first dielectric layer 332, the second metal-containing layer 333, the second dielectric layer 334 and the third dielectric layer 336 of FIG. 23 which correspond to each of the non-pixel regions NPX of the display substrate 110. In some embodiments, the materials and thicknesses of the first light-blocking metal-containing layer 331b, the first light-blocking dielectric layer 332b, the second light-blocking metal-containing layer 333b, the second light-blocking dielectric layer 334b and the third light-blocking dielectric layer 336b are the same as the materials and thicknesses of the first metal-containing layer 331, the first dielectric layer 332, the second metal-containing layer 333, the second dielectric layer 334 and the third dielectric layer 336 of FIG. 23, respectively.

In some embodiments, the blocking layer 335 disposed on the bottom surface of the encapsulation member 120 is located at a position corresponding to each of the non-pixel regions NPX of the display substrate 110. Thus, the blocking layer 335 may protrude from the bottom surface of the encapsulation member 120.

As described above, the first light-transmitting metal-containing layer 331a, the first light-transmitting dielectric layer 332a, the second light-transmitting metal-containing layer 333a, the second light-transmitting dielectric layer 334a and the third light-transmitting dielectric layer 336a as well as the first light-blocking metal-containing layer 331b, the first light-blocking dielectric layer 332b, the second light-blocking metal-containing layer 333b, the second light-blocking dielectric layer 334b and the third light-blocking dielectric layer 336b are portions of the first metal-containing layer 331, the first dielectric layer 332, the second metal-containing layer 333, the second dielectric layer 334 and the third dielectric layer 336 of FIG. 23, respectively. Therefore, the first light-transmitting metal-containing layer 331a, the first light-transmitting dielectric layer 332a, the second light-transmitting metal-containing layer 333a, the second light-transmitting dielectric layer 334a and the third light-transmitting dielectric layer 336a may have the same thicknesses as and may be formed of the same materials as the first light-blocking metal-containing layer 331b, the first light-blocking dielectric layer 332b, the second light-blocking metal-containing layer 333b, the second light-blocking dielectric layer 334b and the third light-blocking dielectric layer 336b, respectively. In some embodiments, the total thickness of the light-blocking portion LBP3 is greater than that of the light-transmitting portion LTP3 due to the blocking layer 235.

As described above, the light-emitting display device 300 according to the current embodiment has the destructive interference unit 330 including a plurality of metal-containing layers (331, 333) and a plurality of dielectric layers (332, 134, 336), which are alternately stacked on the encapsulation member 120, and the blocking layers 335. The destructive interference unit 330 can replace a circular polarizing film, reduce reflectance of ambient light, reduce a thickness of the light-emitting display device 300, and simplify the process of fabricating the light-emitting display device 300.

In some embodiments, the method of fabricating the light-emitting display device 300 may be the same as the method of fabricating the light-emitting display device 200, except that a process of forming the third dielectric layer 336 is additionally performed before the first metal-containing layer 331 is formed in an operation of forming a destructive interference unit. Therefore, a detailed description of the method of fabricating the light-emitting display device 300 according to the current embodiment will be omitted.

Embodiments of the present disclosure provide at least one of the following advantages.

A light-emitting display device according to embodiments of the present disclosure may have a destructive interference unit including a plurality of metal-containing layers and a plurality of dielectric layers, which are alternately stacked on an encapsulation member, and blocking layers. The destructive interference unit can replace a circular polarizing film, reduce reflectance of ambient light, reduce a thickness of the light-emitting display device, and simplify a process of fabricating the light-emitting display device.

While the embodiments have been described with reference to preferred embodiments, it will be apparent to those skilled in the art that many variations and modifications can be made to the preferred embodiments without substantially departing from the principles of the present disclosure. Therefore, the disclosed preferred embodiments are used in a generic and descriptive sense only and not for purposes of limitation.

What is claimed is:

1. A light-emitting display device comprising:
a display substrate which comprises a pixel region and a non-pixel region;
an encapsulation member which is disposed above the display substrate;
a destructive interference layer which is formed on the encapsulation member and comprises a first portion corresponding to the pixel region and a second portion corresponding to the non-pixel region, wherein the destructive interference layer causes reflected lights of ambient light incident from outside the destructive interference layer to disappear by destructively interfering the reflected lights each other; and
a blocking pattern which is formed on the encapsulation member and is located to overlap with the second portion of the destructive interference layer, wherein the blocking pattern absorbs the ambient light incident from outside the destructive interference layer.

2. The light-emitting display device of claim 1, wherein the destructive interference layer comprises a plurality of metal-containing layers and a plurality of dielectric layers which are stacked alternately, and wherein a total thickness of the second portion of the destructive interference layer is greater than a total thickness of the first portion of the destructive interference layer.

3. The light-emitting display device of claim 1, wherein the destructive interference layer is disposed at an upper part or at a lower part of the encapsulation member, and the destructive interference layer comprises:
a first metal-containing layer which is formed on the encapsulation member;
a first dielectric layer which is formed on the first metal-containing layer;
a second metal-containing layer which is formed on the first dielectric layer; and
a second dielectric layer which is formed on the second metal-containing layer.

4. The light-emitting display device of claim 3, wherein the blocking pattern is interposed between the encapsulation member and the first metal-containing layer when the destructive interference layer is disposed at the upper part of the encapsulation member and is located between the second dielectric layer and the display substrate when the destructive interference layer is disposed at the lower part of the encapsulation member.

5. The light-emitting display device of claim 4, wherein the first metal-containing layer, the first dielectric layer, the second metal-containing layer, and the second dielectric layer of the first portion have the same thicknesses as and are formed of the same materials as the first metal-containing layer, the first dielectric layer, the second metal-containing layer, and the second dielectric layer of the second portion, respectively.

6. The light-emitting display device of claim 3, wherein each of the first metal-containing layer and the second metal-containing layer is formed of a metal-containing material having a refractive index of 1.5 to 7 and an extinction coefficient of 1.5 to 7, and each of the first dielectric layer and the second dielectric layer is formed of any one of silicon oxide ($SiO_2$), titanium oxide ($TiO_2$), lithium fluoride (LiF), calcium fluoride ($CaF_2$), magnesium fluoride ($MgF_2$), silicon nitride, tantalum oxide ($Ta_2O_5$), niobium oxide ($Nb_2O_5$), silicon carbonitride (SiCN), molybdenum oxide, iron oxide and chrome oxide, and wherein a thickness of each of the first metal-containing layer and the second metal-containing layer is set to a thickness that satisfies Equation (1):

$$d1 \leq 0.6\lambda/2\pi n1k1, \quad (1)$$

where d1 is the thickness of each of the first metal-containing layer and the second metal-containing layer, $\lambda$ is a wavelength of ambient light, n1 is a refractive index of each of the first metal-containing layer and the second metal-containing layer, and k1 is an extinction coefficient of each of the first metal-containing layer and the second metal-containing layer.

7. The light-emitting display device of claim 6, wherein each of the first metal-containing layer and the second metal-containing layer is formed of any one of chrome (Cr), molybdenum (Mo), tungsten (W), titanium (Ti), nickel (Ni), cobalt (Co), copper oxide (CuO), titanium nitride, and nickel sulfide (NiS).

8. The light-emitting display device of claim 6, wherein the first dielectric layer has a thickness that satisfies Equation (2):

$$(n1d1)+(n2d2)=\lambda/4, \quad (2)$$

where, n1 is the refractive index of the second metal-containing layer, n2 is a refractive index of the first dielectric layer, d1 is the thickness of the second metal-containing layer, d2 is the thickness of the first dielectric layer and $\lambda$ is the wavelength of ambient light when the destructive interference layer is disposed at the upper part of the encapsulation member, and, n1 is the refractive index of the first metal-containing layer, n2 is the refractive index of the first dielectric layer, d1 is the thickness of the first metal-containing layer, d2 is the thickness of the first dielectric layer and $\lambda$ is the wavelength of ambient light when the destructive interference layer is disposed at the lower part of the encapsulation member.

9. The light-emitting display device of claim 1, wherein the blocking pattern is formed of any one of Cr, Mo, aluminum (Al), silver (Ag), Ti, carbon black and CuO and has a thickness of 50 nm or more.

10. The light-emitting display device of claim 4, wherein when the destructive interference layer is disposed at the lower part of the encapsulation member, a third dielectric layer is formed between the encapsulation member and the first metal-containing layer, and a third dielectric layer is formed between the encapsulation member and the first metal-containing layer, wherein the third dielectric layer and the third dielectric layer have the same thickness and are formed of the same material.

11. A light-emitting display device comprising:
a display substrate which comprises a pixel region and a non-pixel region;
an encapsulation member which is disposed above the display substrate;
a destructive interference layer which is formed on the encapsulation member,
wherein the destructive interference layer comprises a plurality of metal-containing layers and a plurality of dielectric layers which are stacked alternately, and
wherein the destructive interference layer comprises first portion corresponding to the pixel region and a second portion corresponding to the non-pixel region, wherein the destructive interference layer causes reflected lights of ambient light incident from outside the destructive interference layer to disappear by destructively interfering the reflected lights each other; and
a blocking pattern which is formed on the encapsulation member and is located to overlap with the second portion of the destructive interference layer, wherein the blocking pattern absorbs the ambient light incident from outside the destructive interference layer.

12. The light-emitting display device of claim 11, wherein the destructive interference layer comprises:
- a first metal-containing layer which is formed on the encapsulation member;
- a first dielectric layer which is formed on the first metal-containing layer;
- a second metal-containing layer which is formed on the first dielectric layer; and
- a second dielectric layer which is formed on the second metal-containing layer, and
- wherein the blocking pattern is disposed between the encapsulation member and the first metal-containing layer or is disposed between the second dielectric layer and the display substrate.

13. The light-emitting display device of claim 12, wherein each of the first metal-containing layer and the second metal-containing layer is formed of a metal-containing material having a refractive index of 1.5 to 7 and an extinction coefficient of 1.5 to 7, and each of the first dielectric layer and the second dielectric layer is formed of any one of $SiO_2$, $TiO_2$, $LiF$, $CaF_2$, $MgF_2$, silicon nitride, $Ta_2O_5$, $Nb_2O_5$, SiCN, molybdenum oxide, iron oxide and chrome oxide, and wherein a thickness of each of the first metal-containing layer and the second metal-containing layer is set to a thickness that satisfies Equation (1):

$$d1 \leq 0.6\lambda/2\pi n1k1, \quad (1)$$

where d1 is the thickness of each of the first metal-containing layer and the second metal-containing layer, $\lambda$ is a wavelength of ambient light, n1 is a refractive index of each of the first metal-containing layer and the second metal-containing layer, and k1 is an extinction coefficient of each of the first metal-containing layer and the second metal-containing layer.

14. The light-emitting display device of claim 13, wherein each of the first metal-containing layer and the second metal-containing layer is formed of any one of Cr, Mo, W, Ti, Ni, Co, CuO, titanium nitride, and NiS.

15. The light-emitting display device of claim 13, wherein the first dielectric layer has a thickness that satisfies Equation (2):

$$(n1d1)+(n2d2)=\lambda/4, \quad (2)$$

where, n1 is the refractive index of the second metal-containing layer, n2 is a refractive index of the first dielectric layer, d1 is the thickness of the second metal-containing layer, d2 is the thickness of the first dielectric layer and $\lambda$ is the wavelength of ambient light when the destructive interference layer is disposed at an upper part of the encapsulation member, and, n1 is the refractive index of the first metal-containing layer, n2 is the refractive index of the first dielectric layer, d1 is the thickness of the first metal-containing layer, d2 is the thickness of the first dielectric layer and $\lambda$ is the wavelength of ambient light when the destructive interference layer is disposed at a lower part of under the encapsulation member.

16. The light-emitting display device of claim 11, wherein the blocking pattern layer is formed of any one of Cr, Mo, Al, Ag, Ti, carbon black and CuO and has a thickness of 50 nm or more.

17. The light-emitting display device of claim 12, wherein when the destructive interference layer is disposed at the lower part of the encapsulation member, a third dielectric layer is formed between the encapsulation member and the first metal-containing layer.

18. A method of fabricating a light-emitting display device, the method comprising:
- preparing a display substrate comprising a pixel region and a non-pixel region;
- forming a destructive interference layer comprising a plurality of metal-containing layers and a plurality of dielectric layers which are stacked alternately on an encapsulation member,
- wherein the destructive interference layer comprises first portion corresponding to the pixel region and a second portion corresponding to the non-pixel region, and
- wherein the destructive interference layer causes reflected lights of ambient light incident from outside the destructive interference layer to disappear by destructively interfering the reflected lights each other; and
- forming a blocking pattern which is disposed on the encapsulation member and is located to overlap with the second portion of the destructive interference layer, wherein the blocking pattern absorbs the ambient light incident from outside the destructive interference layer.

19. The method of claim 18, wherein the forming of the destructive interference layer comprises:
- forming a first metal-containing layer on the encapsulation member;
- forming a first dielectric layer on the first metal-containing layer;
- forming a second metal-containing layer on the first dielectric layer; and
- forming a second dielectric layer on the second metal-containing layer, and
- wherein the forming of the pattern comprises forming the blocking pattern between the encapsulation member and the first metal-containing layer or between the second dielectric layer and the display substrate.

20. The method of claim 19, wherein the forming of the blocking pattern comprises applying a blocking material to the whole top surface of the encapsulation member and patterning the blocking material and forming of the first metal-containing layer comprises applying a first metal-containing material to the whole top surface of the encapsulation member to cover the blocking pattern when the blocking pattern is formed between the encapsulation member and the first metal-containing layer, and wherein the forming of the blocking pattern comprises applying the blocking material to the whole bottom surface of the second dielectric layer and patterning the blocking material when the blocking pattern is formed on the second dielectric layer.

* * * * *

UNITED STATES PATENT AND TRADEMARK OFFICE
CERTIFICATE OF CORRECTION

PATENT NO. : 9,066,380 B2  
APPLICATION NO. : 14/061631  
DATED : June 23, 2015  
INVENTOR(S) : Sang Hwan Cho Page 1 of 1

It is certified that error appears in the above-identified patent and that said Letters Patent is hereby corrected as shown below:

In the Claims

In column 24 at line 2, In Claim 16, after "pattern" delete "layer".

In column 24 at line 40, In Claim 19, before "pattern" insert --blocking--.

Signed and Sealed this  
Twenty-sixth Day of April, 2016

Michelle K. Lee  
*Director of the United States Patent and Trademark Office*